United States Patent

Bäcklund et al.

[11] Patent Number: 6,137,172
[45] Date of Patent: *Oct. 24, 2000

[54] METHOD AND DEVICE FOR POSITIONING AND RETAINING MICRO-BUILDING-BLOCKS

[75] Inventors: Ylva Bäcklund; Carola Strandman, both of Uppsala, Sweden

[73] Assignee: Telefonaktiebolaget LM Ericsson, Stockholm, Sweden

[*] Notice: This patent issued on a continued prosecution application filed under 37 CFR 1.53(d), and is subject to the twenty year patent term provisions of 35 U.S.C. 154(a)(2).

[21] Appl. No.: 08/954,731

[22] Filed: Oct. 20, 1997

[30] Foreign Application Priority Data

Oct. 21, 1996 [SE] Sweden ................................ 9603864

[51] Int. Cl.[7] .............................. H01L 23/42; H01L 21/60
[52] U.S. Cl. ........................ 257/727; 257/666; 257/731; 257/732; 361/752; 361/758; 361/759
[58] Field of Search .................................... 257/666, 726, 257/727, 731, 732; 361/600, 732, 748, 752, 758, 759

[56] References Cited

U.S. PATENT DOCUMENTS

| | | |
|---|---|---|
| 3,568,012 | 3/1971 | Ernst ........................................ 317/234 |
| 4,433,886 | 2/1984 | Cassarly et al. ............................ 339/14 |
| 4,435,724 | 3/1984 | Ralstin ...................................... 357/79 |

FOREIGN PATENT DOCUMENTS

| | | | |
|---|---|---|---|
| 363232342 | 9/1988 | Japan ..................................... 257/690 |
| 401122144 | 5/1989 | Japan ..................................... 257/676 |
| 403203360 | 9/1991 | Japan ..................................... 257/676 |
| WO96/34305 | 10/1996 | WIPO . |

OTHER PUBLICATIONS

International–Type Search Report corresponding to Application No. SE 9603864–1, mailed Jul. 25, 1997.

*Primary Examiner*—Leo P. Picard
*Assistant Examiner*—Hung Van Duong
*Attorney, Agent, or Firm*—Burns, Doane, Swecker & Mathis, L.L.P.

[57] ABSTRACT

In order to simplify handling and mounting of chips or chip-like structures/micro-blocks, a method and a device have been developed, by which, depending on the area of use, one or more chips can be assembled to act together and/or act together with other chip-like structures such as micromechanical building elements or microoptical elements. The actual retention of a micro-building-block (1) is achieved by micromechanical tongues (4) acting across holes or cavities (2) in a carrier material (3). Silicon tongues can, for example, be both flexible and sufficiently strong to retain a chip. In this manner, there is assured both precise vertical and horizontal positioning and mechanical retention. Electrical connection to the chip can be effected either by thin film technology or by more conventional wire-bonding.

18 Claims, 1 Drawing Sheet

METHOD AND DEVICE FOR POSITIONING AND RETAINING MICRO-BUILDING-BLOCKS

TECHNICAL FIELD

The present invention relates to a method of positioning and retaining micro-building-blocks and a device for positioning and retaining micro-building-blocks, the term "micro-building-block" comprising electronic microcircuit elements/chips, micromechanical elements or opto-elements.

1. Background Art

Within opto-electronics, there has arisen an interest in micromechanics and micro-structure technology. This interest is based on the knowledge that micromechanical structures can today be made with very high precision. Micromechanical structures can provide exact positioning of components. For example, it is possible with etched V-grooves in silicon to achieve alignment of optical fibers. With the aid of microstructures it is also possible to achieve alignment when hybrid-mounting opto-components and micromechanical mirrors for angling light. It is also known to use small mechanical holders to hold securely and guide opto fibers in V-shaped groups in silicon substrates (see Swedish Patent Application No. 9501591-5).

2. Description of the Invention

In order to simplify handling and mounting of chips or chip-like structures/micro-blocks, a method and a device have been developed, where, depending on the field of use, one or more chips can be assembled to act together and/or act together with other chip-like structures, such as micromechanical building elements or microoptical elements.

The basic idea for the actual retaining of a micro-building-block is to use micromechanical tongues across holes or cavities, which can be etched in silicon (see FIG. 1). These silicon tongues can be both flexible and sufficiently strong to retain a chip, for example, which trials have shown. In this manner, it is assured that there is achieved both precise positioning, vertically and horizontally, and mechanical retention. Electrical connection to the chip can be achieved either by thin film technology or by more conventional wire-bonding.

PREFERRED EMBODIMENTS

Figure 1:
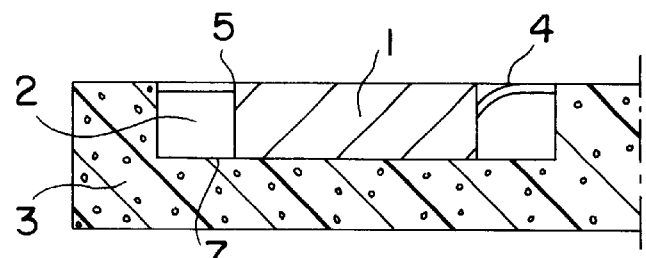
FIG. 1 shows a side view, partially in section, of a micro-building-block inserted and retained in a cavity in accordance with the invention.
Figure 2:
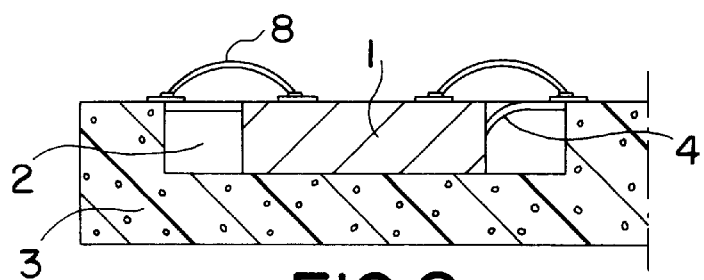
FIG. 2 shows the micro-building-block in FIG. 1, connected electrically by wire-bonding.
Figure 3:
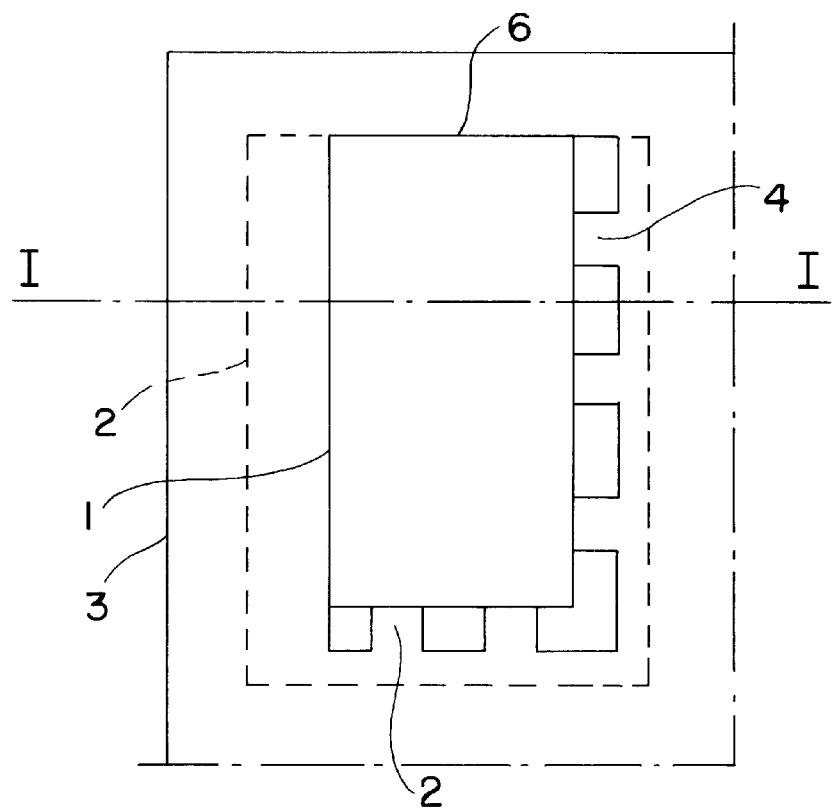
FIG. 3 shows, from above, a micro-building-block inserted and retained in accordance with the invention, by means of silicon tongues.

FIGS. 1–3 show in simplified form how a micro-building-block/chip is inserted into a cavity 2 or a hole in a silicon material 3, where the holder structure consists essentially of micromechanical tongues 4 acting across the cavity 2 on one or two sides. Opposing sides 5,6 without tongues can consist of reference edges/sides for exact positioning of the chip together with the bottom 7 of the cavity. When inserting the chip 1 into the cavity 2, the elastic tongues 4 will be bent down and press with their points the chip against the reference edges 5,6, thereby providing both a precise positioning and retention of the chip. As an alternative to the resilient tongues, resilient leaves lying at the bottom could be used. In a system with one or more rows of cavities, as in a grid, it is possible to position a plurality of different cooperating micro-building-blocks and then join them to achieve a cooperating microsystem.

Several methods of contacting are possible. FIG. 2 shows how wire-bonding 8 has been used but thin film technologies can also be used, since the building method renders the chip on the same level as a surrounding substrate with a conductor pattern.

In hybridization, for example of electronic, optical and mechanical components, a method of mounting in accordance with the invention can be of crucial importance since much importance is placed on increasing the integration of various functions at "chip level". There is still no really good method of integration and it is difficult today to manufacture integrated microsystems on the same substrate. With the microsystem according to the invention, the various parts of the system can be manufactured individually by existing methods and thereafter be brought together and placed in their respective cavities in a carrier material. By packing chips together in this manner, the design and shape rules for supply lines and contact surfaces can be further refined.

By using the cavity for mounting opto-components/opto-chips, these can be passively aligned with a waveguide lithographically defined relative to the cavity. In the same manner, opto-components can be passively aligned with opto-fibers in lithographically defined guide structures in a carrier.

Multichip modules (MCM) consisting of a plurality of chips linked together by a plurality of strip wires, can be replaced by a carrier with a plurality of cavities, in which the individual chips are placed to be subsequently linked together by lithographically defined methods/thin film technology. By using this technology, grids of chip structures can be built up and linked together, thus providing very complex systems with individually replaceable micro-building-blocks. The cavity structure can also be used as a test fixture for MCM-chips enabling the entire chip set for an MCM to be tested prior to mounting by using a cavity structure where each chip has its own predetermined position. A connecting fixture adapted to this purpose could temporarily link all the chips so that an electrical evaluation could be made.

Instead of using silicon as a carrier material, plastic could be used and especially so-called replicated plastic, which could provide extremely good positioning of the micro-building-blocks set in place by its precisely defined reference edges and its bottom with or without inlaid grooves for waveguides/optical fibers in the surface of the carrier material between the cavities. When using replicated plastic for manufacture of carrier materials, instead of resilient elements acting against the chip, nonelastically acting deformable projections arranged in the plastic could be used instead, which would fix the mounted chip against the reference edges when the chip is pressed into the cavity.

What is claimed is:

1. A device for retaining a micro-building-block, comprising:

a carrier having a silicon material body in which a cavity is provided for receiving a micro-building-block, said cavity having a bottom surface against which the micro-building-block abuts when the micro-building-block is received by said cavity, said cavity having a side surface, said side surface being non-parallel with said bottom surface, said carrier having at least one tongue formed from silicon material located opposite from said side surface, said at least one tongue being adapted to press the micro-building-block against said side surface to retain the micro-building-block in said cavity.

2. The device of claim 1, wherein said side surface is planar and perpendicular to said bottom surface.

3. The device of claim 1, further comprising a plurality of said tongues, said tongues being spaced from each other.

4. The device of claim 1, wherein said side surface includes a first side surface, said at least one tongue comprising a plurality of said tongues and said side surface including a second side surface, said second side surface being non-parallel with said bottom surface, said first side surface being perpendicular to said second side surface, said plurality of tongues including tongues located opposite from said second side surface for pressing the micro-building-block against said second side surface to retain said micro-building-block in said cavity.

5. The device of claim 1, wherein said cavity is rectangular.

6. The device of claim 1, further comprising means for defining an electrical connection to the micro-building-block.

7. The device of claim 1, further comprising means for defining an optical connection to the micro-building-block.

8. A device for retaining a micro-building-block, comprising:

a carrier having a body in which a cavity is provided for receiving a micro-building-block, said cavity having a bottom surface against which the micro-building-block abuts when the micro-building-block is received by said cavity, said cavity having a side surface, said side surface being non-parallel with said bottom surface, said carrier having at least one tongue formed from material forming the body and located opposite from said side surface, said at least one tongue being adapted to press the micro-building-block against said side surface to retain the micro-building-block in said cavity, wherein said body is plastic material.

9. The device of claim 1, wherein said cavity is an etched-out space in a silicon body.

10. The device of claim 1, wherein the micro-building-block includes an electrical device.

11. The device of claim 1, wherein the micro-building-block includes an optical device.

12. The device of claim 1, wherein the carrier includes a plurality of said cavities each for receiving a micro-building-block.

13. The device of claim 1, further comprising the micro-building-block, said micro-building-block being located in said cavity and abutting against said bottom surface, said at least one tongue pressing said micro-building-block against said side surface to retain said micro-building-block in said cavity.

14. A device for retaining a micro-building-block, comprising:

a carrier having a body formed of silicon material in which a cavity is provided for receiving the micro-building-block, said cavity having a bottom surface against which the micro-building-block abuts when the micro-building-block is received by said cavity, said cavity having a side surface, said side surface being perpendicular to said bottom surface, said carrier having means for pressing the micro-building-block against said side surface to retain the micro-building-block in said cavity, the pressing means being formed of silicon material.

15. The device of claim 14, wherein said side surface includes a first side surface, said pressing means comprising a plurality of tongues and said side surface further includes a second side surface, said second side surface being non-parallel with said bottom surface, said first side surface being perpendicular to said second side surface, said plurality of tongues including tongues located opposite from said second side surface for pressing the micro-building-block against said second side surface to retain said micro-building-block in said cavity.

16. A method comprising:

providing a cavity in a carrier body, the carrier body being formed of silicon, the cavity being defined by a bottom surface, a side surface extending at an angle from the bottom surface, and at least one tongue extending from the side surface; and arranging a micro-building-block in the cavity such that the micro-building-block abuts against the bottom surface of said cavity and is retained in the cavity by the at least one tongue, the at least one tongue pressing the micro-building-block against the side surface.

17. The method of claim 16, wherein the cavity is defined by a plurality of tongues and the micro-building-block is arranged in the cavity such that the micro-building-block is retained in the cavity by the plurality of tongues.

18. The method of claim 17, wherein the side surface includes a first side surface and a second side surface that is perpendicular to the first side surface, the micro-building-block being arranged in the cavity such that the micro-building-block is retained in the cavity by the plurality of tongues that press the micro-building-block against the first side surface and the second side surface.

* * * * *